United States Patent [19]

Fukushima

[11] Patent Number: 4,792,833
[45] Date of Patent: Dec. 20, 1988

[54] JUNCTION-SHORTING TYPE SEMICONDUCTOR READ-ONLY MEMORY HAVING INCREASED SPEED AND INCREASED INTEGRATION DENSITY

[75] Inventor: Toshitaka Fukushima, Yokohama, Japan

[73] Assignee: Fujitsu Limited, Kawasaki, Japan

[21] Appl. No.: 933,866

[22] Filed: Nov. 24, 1986

[30] Foreign Application Priority Data

Nov. 28, 1985 [JP] Japan ................. 60-267896

[51] Int. Cl.[4] ............... H01L 29/72; H01L 49/00; H01L 27/04; H01L 27/10
[52] U.S. Cl. .......................... 357/86; 357/34; 357/49; 357/50; 357/45; 357/59; 365/175; 365/103; 365/104; 365/105
[58] Field of Search ............ 357/49, 50, 86, 45, 357/34, 59; 365/175, 103, 104, 105

[56] References Cited

U.S. PATENT DOCUMENTS

| | | | |
|---|---|---|---|
| 4,454,647 | 6/1984 | Joy et al. | 357/49 |
| 4,612,465 | 9/1986 | Schutten et al. | 357/86 |
| 4,631,570 | 12/1986 | Birrittella | 357/50 |

OTHER PUBLICATIONS

IEEE Transactions on Electron Devices, vol. ED-30, No. 12, Dec. 1983, "An Advanced SVG Technology for 64k Junction-Shorting PROM's", Fukushima et al., pp. 1785–1791.
IEEE Journal on Solid-State Circuits, vol. SC-19, No. 2, Apr. 1984, "A 40 ns 64 Kbit Junction-Shorting PROM", Fukushima et al., pp. 187–194.

Primary Examiner—Martin H. Edlow
Assistant Examiner—David R. Josephs
Attorney, Agent, or Firm—Staas & Halsey

[57] ABSTRACT

In a junction-shorting type PROM, including transistors, a highly doped region having the same conductivity type as a base is provided between a pair of memory cells. This region is a base contact region which commonly connects paired bases at a surface terminal connected to a word line. The base contact region also extends into the substrate, which is a collector, and prevents minority carries in each of the paired bases from diffusing into an adjacent base, and thus, prevents influence between the paired memory cells. The base contact region may be isolated from emitter regions by a narrow groove filled with insulation material. The narrow groove is deeper than the emitter regions but shallower than the substrate. A memory cell block composed of the paired cells and the base contact region is isolated at its circumference by the narrow groove. The narrow isolation grooves and the elimination of a conventional buried base layer reduce stray capacitance and increase the current amplification factors of the transistors. In addition, less current is required, thus increasing the switching speed, lowering power comsumption, and reducing the occupation area for memory cells and the peripheral circuit, resulting in increased integration density.

24 Claims, 5 Drawing Sheets

JUNCTION-SHORTING TYPE SEMICONDUCTOR READ-ONLY MEMORY HAVING INCREASED SPEED AND INCREASED INTEGRATION DENSITY

BACKGROUND OF THE INVENTION

1. Field of the Invention

The present invention relates to an improved semiconductor read-only memory (referred to hereinafter as a PROM) having a diode which is written into by shorting its junction. More particularly, the present invention relates to a structure of a memory cell which achieves increased integration density and increased operation speed.

2. Description of the Related Art

The principle of a typical junction shorting PROM is illustrated in FIG. 1. The PROM includes word lines $W_o, W_1, \ldots$, bit lines $B_o, B_1, \ldots$, and memory cells, respectively connected at intersections of the word lines and bit lines. A memory cell MC includes a series connection of a transistor Q and a diode D which is polarized so as to block a current flowing through the transistor. The cathode of the diode is connected to a bit line, and the base of the transistor is connected to a word line. The structure of the memory cell is shown in the cross-sectional view of FIG. 1(b). A n+-type region 1 and a p+-type region 2, beneath the n+-type region 1, form the cathode and the anode of the diode D, respectively. The p+-type region 2, a n-type region 3 and a substrate SUB form an emitter, base and collector of a pnp transistor Q, respectively. The pn junction of the diode is shorted by applying a voltage higher than the breakdown voltage of the reverse connected diode D. That is, a current high enough to short the pn junction of the diode is applied during a write-in operation. A shorted memory cell is indicated by MC' in FIG. 1(b). When a word line having a shorted diode connected thereto is selected (i.e., addressed) by applying a low level "L" to the base of the transistor Q, the transistor becomes conductive and pulls the connected bit line down to the low level "L". However, when the diode is not written into, the diode is non-conductive and the connected bit line is not pulled down, keeping the high level "H" on the selected bit line connected to this memory cell, even if the transistor Q becomes conductive. Thus, an addressed bit line having the high level "H", can read out "1" or "0" data stored in the memory cell connected thereto, by detecting whether a current flows into the bit line.

Since PROMs, having 256 and 512 bits, were first developed in 1970, their memory capacity has been enhanced to 64K bits. Further increase in the integration capacity is still expected. Reviewing the history of the development of PROMs, at early stages of junction-shorting type PROMs, a gold diffused TTL technique was employed. Thereafter, a more precise lithography technique for greater density integration, a washed emitter technique, and a mask self-alignment technique have been employed. In addition to these techniques, a technique for suppressing a parasitic thyristor effect caused by the increased integration density has been developed. These are reported by the present inventors in "An Advanced SVG Technology for 64K Junction-Shorting PROM's", IEEE Transactions on Electron Devices, Vol. ED-30, No. 12, December, 1983. The problems of the thyristor effect shall be further described in some detail.

When one of the memory cells is written into and an adajcent memory cell, fabricated on a common epitaxial layer, is not written into, a parasitic pnpn element is provided. That is, a thyristor is produced between these two cells, as shown by the dotted lines in FIG. 1(c). If the thyristor turns on, the selected bit line $B_1$ having a high level "H" is clamped to the unselected bit line $B_o$ having a low level "L". In this state, any other memory cell connected to the bit line $B_1$ cannot be written into because there is insufficient voltage on the bit line $B_1$. As is widely known, a thyristor is composed of two transistors, a npn transistor and a pnp transistor, and the breakdown voltage $V_{Bo}$ of the thyristor is determined using the following formula:

$$V_{Bo} = V_{CBo}(1 - a_n - a_p)^{1/n} \quad (1)$$

and the thyristor latches at:

$$a_n + a_p \approx 1 \quad (2)$$

where $V_{CBo}$ denotes the collector-base breakdown voltage of the parasitic npn transistor, $a_n$ and $a_p$ denote the current amplification factors of the npn transistor and the pnp transistor, respectively, and n is a constant.

Consequently, in order to prevent the latching of the thyristor, $V_{Bo}$ must be large, that is, the current amplification factors $a_n$ and $a_p$ should be small. For this purpose, the p+-type layer, i.e., the base B of the parasitic npn transistor, is thick as shown in FIG. 1(d), resulting in a reduced current amplification factor $a_n$. Furthermore, this thick region also raises the breakdown voltage of the transistor Q. Another measure for preventing the latching of the thyristor includes staggering adjacent memory cells so as to reduce face-to-face portion the peripheral length of the emitters. This results in lowered current amplification factors of the parasitic transistors. These techniques contribute to increasing integration density to produce PROMs of 8K to 256K bits. In addition, the size of the memory cell has shrunk from 1820 $\mu m^2$ to 1260 $\beta m^2$.

However, as long as a gold diffused TTL process is employed, the following problems still remain unsolved for the following reasons. First, because of a segregation problem of gold, a thick epitaxial layer is required (approximately 7 $\mu m$) and consequently, the deeply diffused p+-type base layer (approximately 2 $\mu m$) causes a wider lateral diffusion, resulting in a wider surface occupation area. This limits the integration density. Second, control of gold-doping is difficult because the larger the wafer size becomes, the more uncontrollable the heat capacity becomes. Therefore, the diameter of the wafer cannot be increased. Third, gold particles in the diffused layer cause emitter and collector junctions to short. Therefore, the base width of transistors cannot be reduced and an increase in the current amplification factors of the transistors is limited (i.e., the $h_{FE}$ is approximately 25 to 100). Thus, there are limitations on the reduction in power consumption of the circuit as well as on increasing the operation speed. Fourth, the logic circuit must be saturated, and therefore, the switching speed is limited and cannot be increased.

In order to solve the above-mentioned problems, V-shaped isolation grooves, or so-called SVG (shallow V-shaped grooves), provide perfect separation of the elements by a relatively shallow groove, as shown by V₁ in FIG. 1(f). The V-shaped grooves extend into the upper portion of the buried n⁺-type layer BL, i.e., a buried base lead, from the surface of the epitaxial layer, and perfectly isolate the epitaxial layer of each memory cell. Some conduction may exist through the buried n⁺-type layer B, however, the minority carriers in the epitaxial region cannot diffuse into an adjacent cell because the n⁺-type layer BL is highly doped and recombination of the carriers occurs therein. V₂ indicates another isolation groove which extends into the substrate SUB and completely isolates each memory cell block.

Introduction of the SVG technique allows a process other than gold diffusion to be employed, and thus, advantages are achieved. The advantages include that the parasitic thyristor effect between adjacent cells is completely eliminated. A thin epitaxial layer (having a thickness of approximately 3 $\mu$m) as well as a thin p⁺-type diffused base layer (having a thickness of approximately 0.7 $\mu$m) can be employed in npn transistors of the peripheral circuits, and the integration density can be increased. A wafer diameter can be increased, therefore increasing production efficiency. In addition, the base width of the npn transistor of the peripheral circuit is thin so that the current amplification factor of the transistor is large (i.e., the $h_{FE}$ is approximately 70 to 250), resulting in a high speed operation as well as lower power consumption in the peripheral circuits. In addition, the Schottky diode-clamped TTL technique is employed in peripheral circuits to increase the operation speed.

As described above, due to the V-shaped groove, a 256 to 64K bit PROM employing Schottky diode clamped TTL can be obtained. The area of the memory cell is reduced from 864 $\mu$m² to 252 $\mu$m². This art is reported by the present inventors in "A 40 ns 64K bit Junction-Shorting PROM", IEEE Journal of Solid State Circuits, Vol. SC-19, No. 2, April 1984. However, problems still remain which will be described hereinafter.

SVG isolation is performed by widely known anisotropic etching which uses the characteristics of the (100) crystal orientation of silicon. As is widely known, the relation between the width W of the mask and the depth D of the groove is given by the formula:

$$D = (\tfrac{1}{2}) W \tan 54° \geq 0.7 W \tag{3}$$

Therefore, when the epitaxial layer is 3 $\mu$m thick and the upward diffusion region of the n⁺-type buried layer is 1 $\mu$m thick, the width of the SVG is 3 $\mu$m (a difference of 2 $\mu$m is required). This is automatically determined. Therefore, additional reduction in the isolation width is not possible.

Furthermore, as is widely known, in V-shaped isolation grooves, portions of silicon dioxide (approximately 1 $\mu$m on each side of the V-shaped groove) expand laterally along the surface and form a birds-beak. Therefore, a margin area between adjacent patterns is required, and integration density cannot be improved.

The isolation effect of the SVG occurs when the groove extends into the n⁺-type buried layer. Thus, a thin epitaxial layer is required if the groove width at the surface is to be narrow. Therefore, upward diffusion of the n⁺-type buried layer must be sufficiently controlled. This, however, is difficult. On the other hand, in order to maintain the reliability of the write-in operation, the depth of the p⁺-type layer, i.e., the emitter of the pnp transistor Q, is generally required to be approximately 1.2 $\mu$m thick. In order to obtain a voltage of more than 20V (which is larger than the breakdown voltage between the base and the emitter during a write-in operation), the width of the depletion layer is generally required to be approximately 1 $\mu$m. Therefore, if the upward diffusion of the buried layer is 1 $\mu$m, the epitaxial layer is required to be at least 3 $\mu$m thick.

Further increases in the operation speed and integration density, and/or decreases in the power consideration in the peripheral circuit, which includes, for example, X and Y address inverters, decoder/drivers and a multiplexer, and is connected to receive a chip-enable signal, must be achieved. For solving these problems, stray capacitance in the circuits, particularly the stray capacitance of the word lines, must be reduced and performance of the transistors in the circuits must be up-graded in order to ease the current load of the circuits. An explanation regarding the relationship between these factors and their effects shall be provided in view of the preferred embodiments described in detail herein below.

SUMMARY OF THE INVENTION

It is an object of the present invention to provide a junction-shorting type PROM having an increased integration density as well as an increased operation speed.

In a structure of the memory cell of the junction-shorting type PROM having a diode and a transistor connected in series, a cell is fabricated by stacking diffused layers on a substrate. The present invention provides a memory cell which does not employ a buried layer as a word line. The memory cell is paired with an adjacent cell to form a memory cell block and the memory cell block is further isolated from an adjacent memory cell block with an insulation region surrounding the memory cell block. The detailed structure of the device is as follows.

Between the emitters and bases of the transistors of the memory cell block and isolated from the emitters, a highly doped region, having a conductivity opposite that of the substrate, is provided which contacts the substrate, so as to separate each base region. This prevents the minority carriers in each base region from laterally diffusing into each other. The highly doped region, which is also a base contact region, commonly connects the paired bases of the memory cell block to a corresponding word line fabricated upon the surface of the memory cells. The base contact regions may be separated from each emitter region of the memory cell by a pair of isolation grooves filled with a dielectric material. The isolation regions do not extend into the substrate. The memory cell block is isolated from an adjacent memory cell block by a U-shaped isolation groove filled with a dielectric material. The U-shaped isolation groove extends into the substrate. The occupation area and stray capacitance of the word lines are reduced by the U-shaped isolation groove. Elimination of the buried base conductor also reduces stray capacitance of the word lines, etc., and further reduces the thickness of the epitaxial layer. Reduction of the thickness of the epitaxial layer increases the current amplification factors of the transistors and also contributes to a decrease in the surface area of the peripheral circuit. All these factors contribute to increasing the integration density, increasing the operation speed and decreasing power consumption, not only in the memory cell area, but also in the peripheral circuits.

The above-mentioned features and advantages of the present invention, together with other objects and advantages, which will become apparent, will be more fully described hereinafter.

DESCRIPTION OF THE PREFERRED EMBODIMENT

Figure 2A:
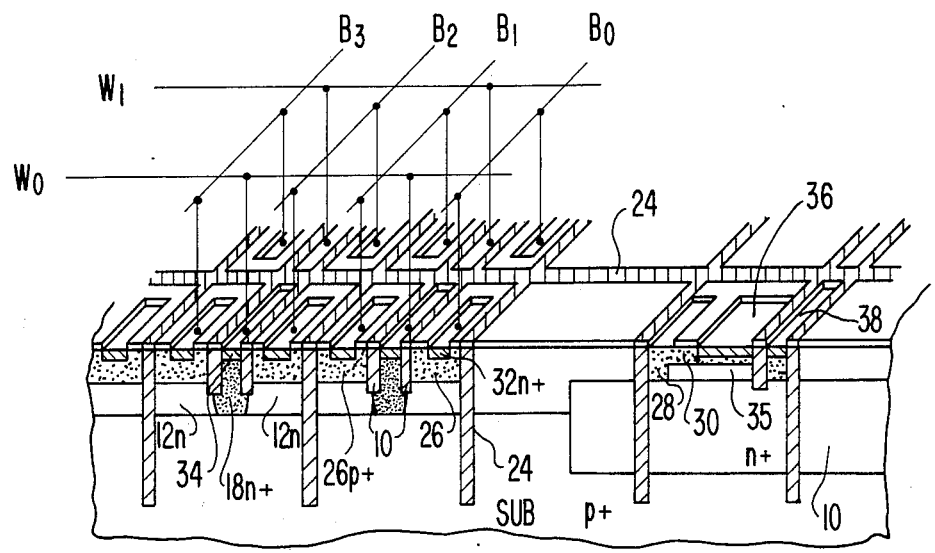
FIG. 2(a) is a perspective view of a memory cell according to an embodiment of the present invention.
Figure 2C:
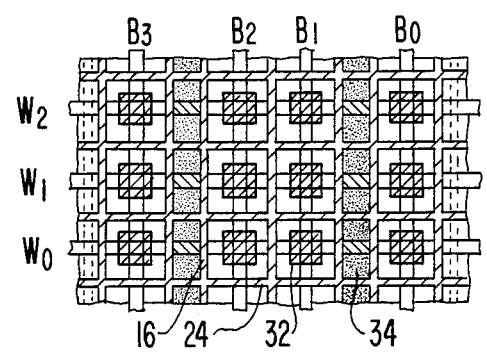
FIG. 2(c) is a plan view of the memory cell blocks of FIG. 2(a)
Figure 2B:
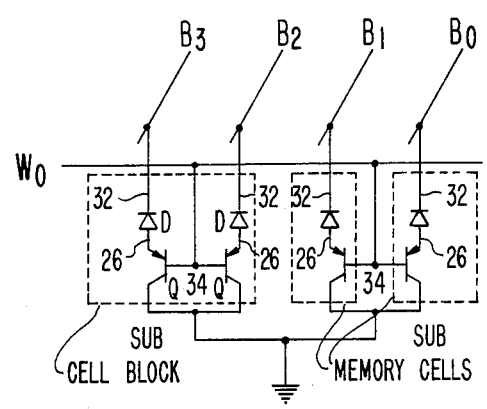
FIG. 2(b) is a circuit diagram of two pairs of memory cells in FIG. 2(a)

Referring to FIGS. 2(a)–2(c), a structure and circuit diagram of the present invention are shown. A n+-type region 32 and a p+-type region 26 form a cathode and an anode of a diode D in a memory cell, respectively. The p+-type region 26, an n-type region 12, a highly doped n+-type diffusion region 18, and a substrate SUB, form an emitter, base, and collector of a pnp transistor Q of the memory cell, respectively. Two adjacent memory cells form a memory cell block which includes paired transistors. The periphery of the cell block is isolated from an adjacent memory cell block by U-shaped isolation regions 24. Each base region of the paired transistors is separated by the highly doped n+-type diffusion region 18 which prevents the diffusion of minority carriers (holes) into other base regions. The highly doped diffusion region 18 also acts as a base contact region which connects the base regions of the paired transistors to a common base contact 34 provided on top of the highly doped n+-type diffusion region 18. Word lines $W_0, \ldots W_3, \ldots$ are respectively connected to corresponding common base contacts 34. Bit lines $B_0, \ldots B_3, \ldots$ are respectively connected to corresponding cathode regions 32 of the diode D.

Figure 3A:
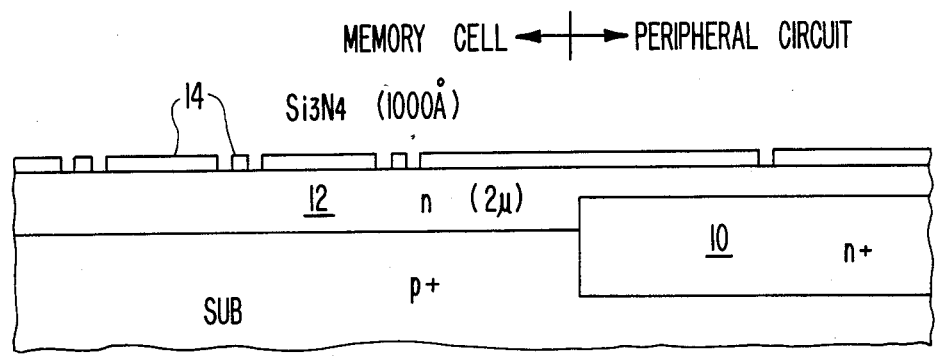
FIGS. 3 through 5 are sequential stages in the fabrication of a PROM according to the present invention.

Referring to FIGS. 3 through 5, the fabrication steps of the PROM according to the invention are explained. As shown in FIG. 3(a), according to a widely known technique used in a general bipolar IC (integrated circuit) fabrication process, an $n^{30}$-type buried layer 10 is formed in an area of the substrate SUB where peripheral circuits are to be fabricated. Next, an n-type epitaxial layer 12 is grown on the substrate and the buried layer 10 by a widely known method used in general bipolar IC fabrication. A silicon nitride film 14 having a thickness of, for example, approximately 1000 Å, is formed on the epitaxial layer 12. The silicon nitride film 14 is then patterned as shown in FIG. 3(a), and windows are opened therein. Next, the epitaxial layer below an opened window in the silicon nitride film 14 is oxidized by a widely known local oxidization method to form a pair of isolation regions 16, each of which protrudes beyond the silicon nitride film 14. The isolation regions 16 prevent lateral expansion of a p+-type diffusion layer 32, which is fabricted later as an emitter of the pnp transistor Q, in the memory cell as well as the lateral expansion of a base contact 34, which is also fabricated later. The regions 16 can also be fabricated by the above-described SVG method. The depth of the isolation regions 16 are deeper than the emitter region, but do not contact the substrate.

Figure 6:
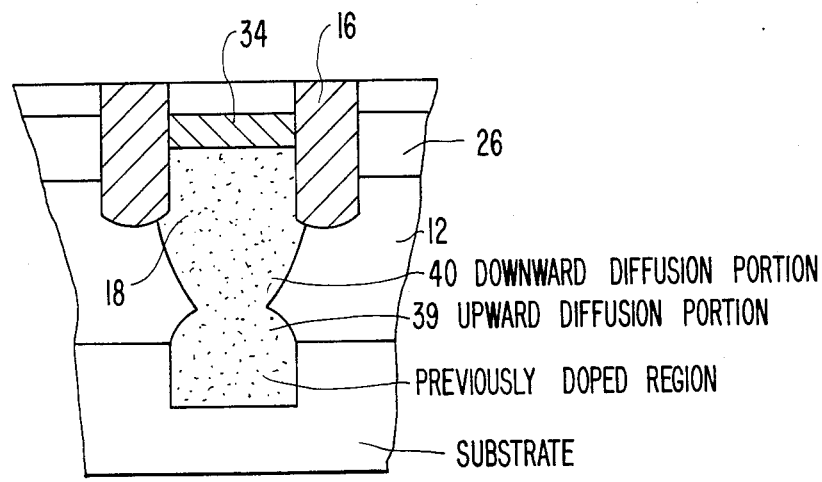
FIG. 6 is a cross-sectional view of an upward diffusion portion and a downward diffusion portion of a highly doped region for forming a base contact.

Next, a dopant, such as phosphorous or arsenic, is diffused into a particular portion of the epitaxial layer 12 located between the paired isolation regions 16 to form a highly doped diffusion region 18, having a concentration of impurities at a surface of, for example, $10^{19} cm^{-3}$. The highly doped diffusion region 18 must be deep enough to reach the substrate SUB so that the diffusion of the minority carriers (holes) in each paired memory cell with respect to an adjacent memory cell is completely prevented. Thus, the highly doped diffusion region 18 is isolated from the emitters by the isolation regions 16 but can contact the base regions. The formation of the highly doped diffusion region 18 may be carried out by a widely known simple diffusion from the surface (downward diffusion) or an ion implantation to form the downward portion 40, and also in combination with an additional upward diffusion to form an upward diffusion portion 39 (shown in FIG. 6) of an n+-type buried layer previously prepared on a portion where the highly doped region 18 is to be formed. When the upward diffusion of the n+-type buried layer is employed, attention must be given to the mask alignment for the upward diffusion portion 39. The alignment, however, is easy because the width of each of the isolation regions 16 is 2 μm and the accuracy of the alignment is below 2 μm. Thus, the downward diffusion portion 40 and the upward diffusion portion 39 will never fully deviate from each other.

Figure 3B:
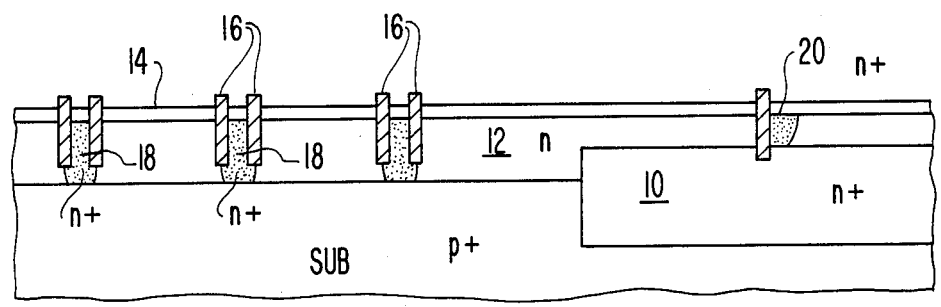
Figure 3C:
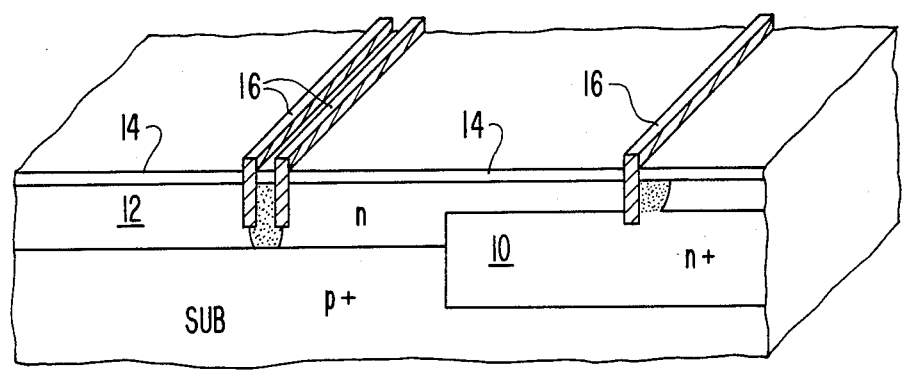
Figure 5A:
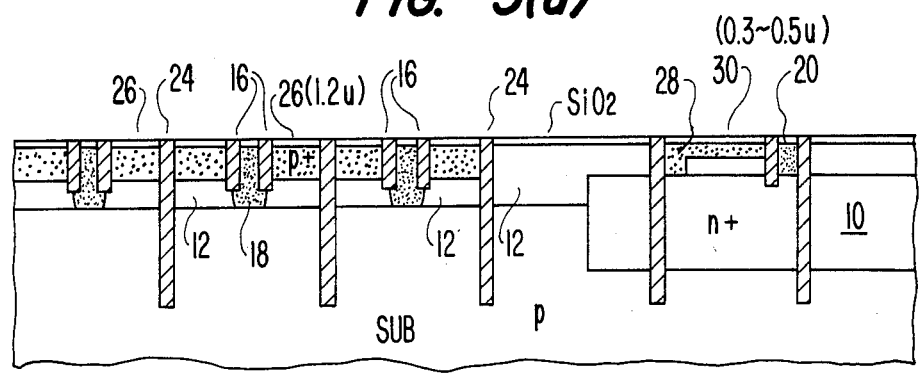
Figure 5B:
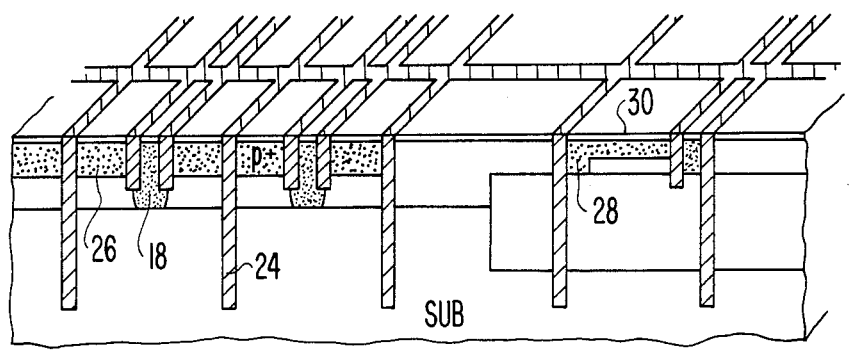
Figure 5C:
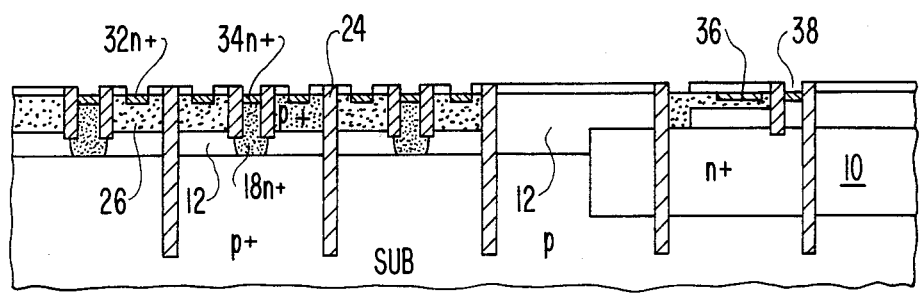
Figure 5D:
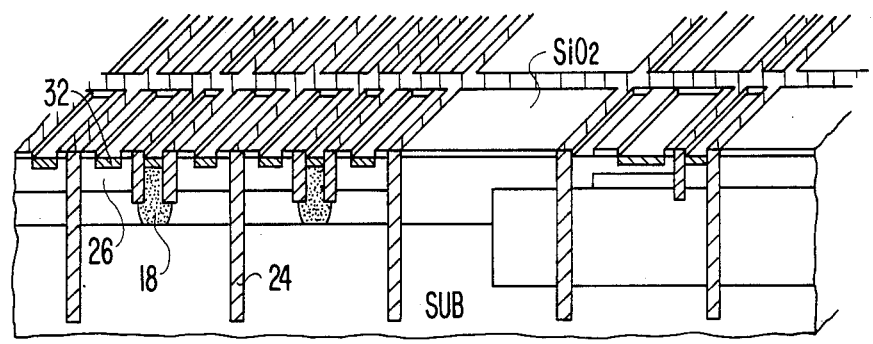

In FIG. 3(b), a highly doped n+-type region 20 acts as a collector contact for connecting a buried layer 10 for a npn transistor in the peripheral circuit to a collector terminal 38 (FIG. 5(c)). FIG. 3(c) is a perspective view of FIG. 3(b). The isolation regions 16 and the highly doped n+-type regions 18 and 20 extend laterally along the surface of the epitaxial layer so that conduction between the elements is prevented.

Figure 4A:
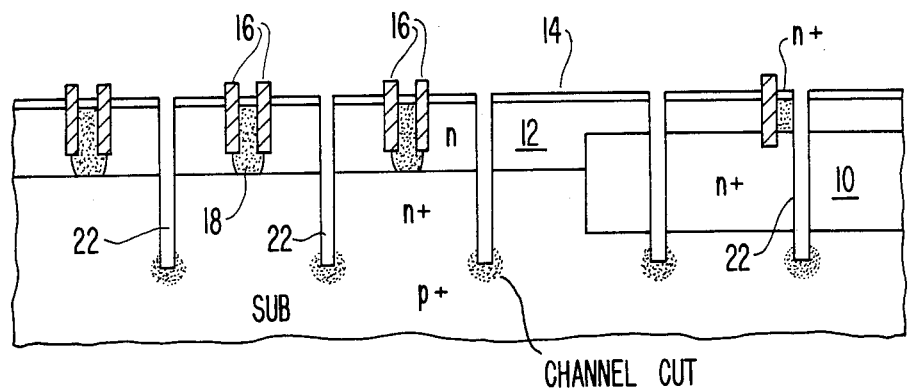
Figure 4B:
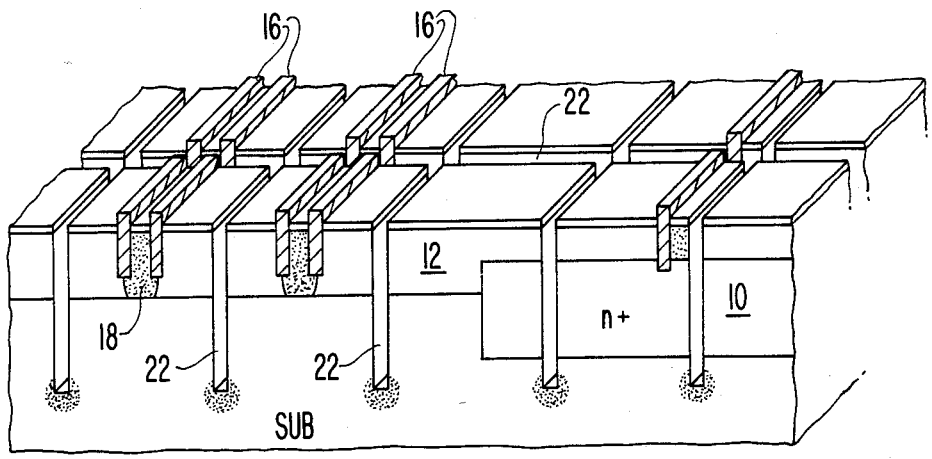

In order to isolate each memory cell block, including the pair of the memory cells, a U-shaped groove 22 is formed as narrow as 1.4 μm between each memory cell block by a widely known technique, such as dry etching, as shown in FIG. 4(a) and FIG. 4(b). Exact control of the depth of the U-shaped groove is generally difficult in contrast with forming a V-shaped groove where the depth D can be controlled by its width W at the surface as described above in equation (3) where D=0.7W. However, in the embodiment of the present invention, exact depth control of the U-shaped groove 22 is not required, because the depth does not really matter as long as the U-shaped groove isolates the memory cell blocks. Therefore, according to the present invention, it is easy to control the fabrication conditions for a PROM.

In the bottom portion of the U-shaped groove 22, a p+-type dopant, such as boron, is diffused, for example, by an ion implantation method to intersect an undesirable electrical channel formed along an outer surface of the groove. The side walls in the U-shaped groove are then oxidized by, for example, a local oxidation method to form an isolation film having a thickness of approximately 3000 Å. The U-shaped grooves extend crosswise along the surface and isolate the entire circumference of each memory cell block.

Polycrystalline silicon is then grown in the U-shaped groove 22, by a widely known method, such as a CVD (chemical vapor deposition) process, to form an isolation wall 24 (FIG. 5(a)) The excessive polycrystalline silicon grown beyond the surface is removed by polishing to form a flat surface. The silicon nitride film 14 is then removed by, for example, chemical etching. The polished surfaces of the polycrystalline silicon and other portions are then oxidized by a widely known method, such as thermal oxidation.

On the specific portion of the n-type epitaxial layer 12, a p+-type dopant, such as boron, is diffused having a concentration of, for example, approximately $10^{14} cm^{-2}$ to form p+-type layers (26 and 28) approximately 1.2 $\mu$m thick and a p+-type layer 30 approximately 0.3 to 0.5 $\mu$m thick, as shown in FIG. 5(a). These p+-type layers form the emitter regions of the pnp transistor Q and the base regions of the npn transistors of the peripheral circuits. Due to the existence of the isolation layer 16, a self-alignment technique can be employed for diffusing these regions. The self-alignment technique contributes to increased integration density without production difficulty.

Next, on specific portions of the p+-type layers 26, 18 and 30, an n+-type dopant is diffused to form n+-type layers 32, 34, 36 and 38 (FIG. 5(c)), respectively. The layer 32 is the cathode of the diode D. The layer 34 is a base contact which makes good contact with external aluminum wirings (fabricated later). The layers 36 and 38 are, respectively, an emitter and a collector of an npn transistor in the peripheral circuit. Upon the surface of these layers, aluminum wirings for forming connections are patterned as shown in FIG. 2(a). Each base contact 34 is connected to a corresponding word line $W_o$, $W_1$, . . . , and each cathode 32 is connected to a corresponding bit line $B_o$, $B_1$, . . . , as mentioned previously. Thus, a pair of memory cells is formed.

The advantages of the embodiment of the present invention shall be hereinafter described. The U-shaped isolation groove reduces the width of the isolation groove to 1.4 $\mu$m, eliminating unnecessary width caused by the prior art, such as the bird-beak, etc., resulting in reduction of the occupation area of the memory cell. The memory cell area is reduced from 252 $\mu m^2$ (as in prior art Schottky diode clamped TTL) to 117 $\mu m^2$ (as in the present invention), which is approximately 46 percent. This reduced cell size reduces the stray capacitance and inductance of the leads in the memory cell area.

The elimination of the prior art buried layer for connecting the bases to the outside improves the PROM in three ways. First, it reduces the stray capacitance of the word lines. Second, it reduces the thickness of the epitaxial layer. Third, the reduced thickness of the epitaxial layer increases the current amplification factor of the transistors in the memory cell and in the peripheral circuits, and reduces the surface occupation area of the transistors. Because of the elimination of the buried layer, the upward diffusion of the buried layer is of course nothing, saving 1 $\mu$m in thickness. Accordingly, the thickness of the epitaxial layer 12 can be reduced from 3 $\mu$m to 2 $\mu$m, which is obtained by adding the thickness of the p+-type layer for forming the diode (i.e, approximately 1.2 $\mu$m) to the thickness of the base (i.e., approximately 0.8 $\mu$m). Therefore, the thickness of the base and emitter, which is essential for reliability of the memory cell during the write-in process, is not sacrificed. The thin, 2 $\mu$m thick, epitaxial layer 12 has a thickness of 1 $\mu$m at the peripheral region where the upward diffusion portion of the n+-type buried layer 10 is 1 $\mu$m thick. The 1 $\mu$m thick portion of the epitaxial layer 12, the 0.3 to 0.5 $\mu$m thick base region 30, and the 0.2 to 0.3 $\mu$m thick emitter 36 allow the width of the lateral diffusion of the emitter to be narrower than that of the thick portion of the epitaxial layer 12, and consequently contributes to reducing the occupied surface area of the transistors in the peripheral circuit.

Figure 1A:
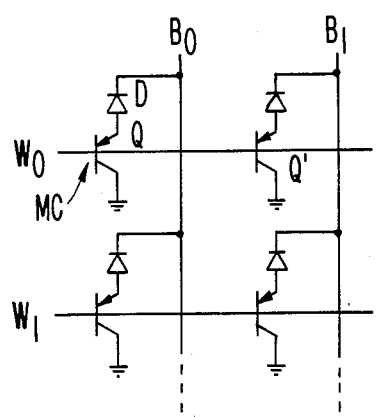
FIG. 1(a) is a circuit diagram of a prior art junction-shorting type PROM.
Figure 1B:
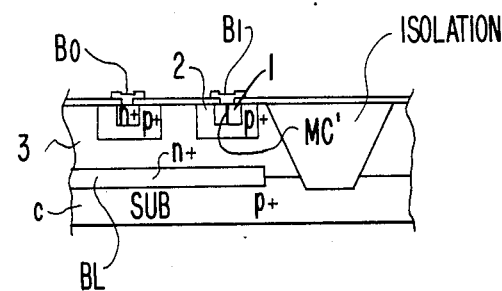
FIG. 1(b) is a cross-sectional view of a memory cell in FIG. 1(a)
Figure 1C:
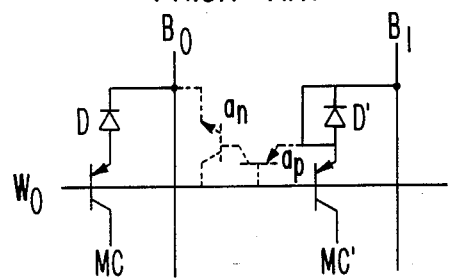
FIG. 1(c) is a diagram of a parasitic thyristor formed between adjacent cells in the memory cells in FIG. 1(a)
Figure 1D:
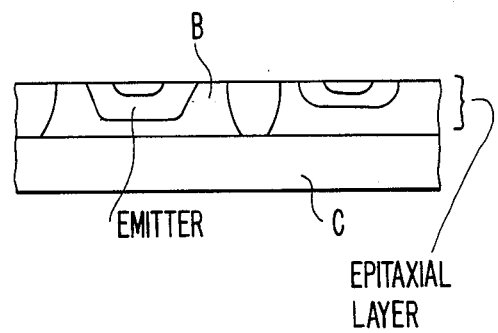
FIG. 1(d) is a cross-sectional view of various layers of the memory cell in FIG. 1(b)
Figure 1E:
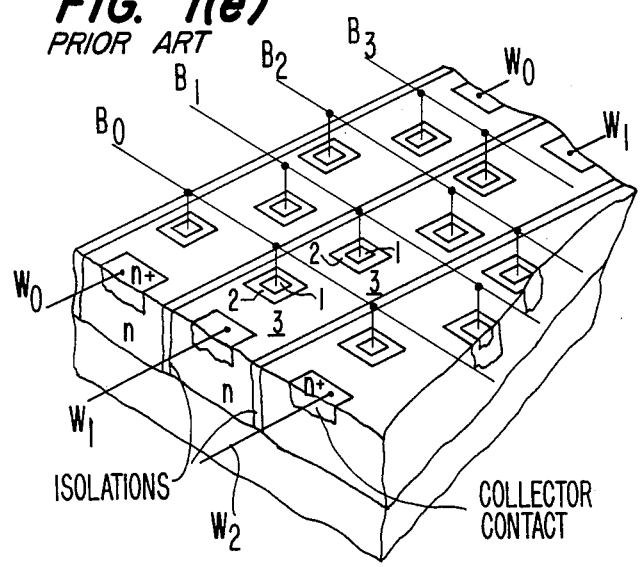
FIG. 1(e) is a perspective view of the memory cells in FIG. 1(a)
Figure 1F:
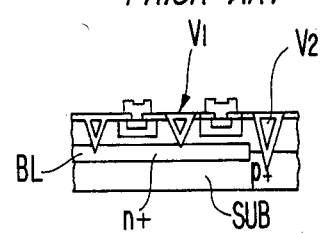
FIG. 1(f) is a cross-sectional view of a memory cell including a SVG.

In addition, the elimination of the buried layer increases the area of the substrate SUB, i.e., the collector, under the emitter 32, as well as decreases the length of the path between the emitter and the collector, compared to prior art structures in which the shortest path between the emitter and the collector is obstructed by the existence of the buried layer (BL in FIG. 1(b)). The increased area as well as decreased path length increases the current amplification factor of the pnp transistor Q of the cell. The $h_{FE}$ of the transistor is raised, for example, from 1.5 to 30. The increased current amplification factor reduces the required base current of the transistor Q, i.e., the addressing current on the word line supplied from the decoder/driver circuit.

During a switching operation, the stray capacitance is charged, during a transient period, by the driver circuit. Therefore, the reduced stray capacitance reduces the required charging current supplied from the driver circuit and keeps the same switching speed. Thus, if the same current is supplied, the charging time is reduced and a fast switching speed is achieved. The reduced addressing current and reduced base current reduces the current load of the peripheral circuit. That is, the reduced current load contributes to a faster switching operation, and results in a simplified structure of the peripheral circuit as well as in a smaller occupation area of the circuit. Thus, integration density is increased, power consumption is reduced and the speed is increased, thereby reducing the address time from 20–25 ns to 10–15 ns. This simplified circuit structure also reduces stray capacitance.

Needless to say, the Schottky diode-clamped transistor technique for high speed operation is inherent in the peripheral circuit of the present invention.

The above-mentioned embodiment was made referring to a device having a p+-type conduction substrate. However, an n+-type oonduction substrate can be used according to circuit requirements, with appropriate modifications.

The many features and advantages of the present invention are apparent from the detailed specification, and thus, it is intended by the appended claims to cover all such features and advantages of the system which fall within the true spirit and scope of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

What is claimed is:

1. A junction-shorting type semiconductor programmable read only memory having a plurality of word lines, a plurality of bit lines intersecting the plurality of word lines, and memory cells formed at the intersections of the word lines and the bit lines, said memory cell comprising:

a semiconductor substrate having a first conductivity type;

a pair of first regions, having a second conductivity type opposite the first conductivity type, formed on said substrate;

first dielectric isolation means, surrounding said pair of first regions and contacting said substrate, for isolating said pair of first regions;

a second region, formed between said pair of first regions and contacting said substrate having a higher doping concentration than said pair of first regions, and doped with a dopant having the second conductivity type, and dividing said pairs of first regions, said second region forming a lead to connect said divided pair of first regions to respective ones of the word lines;

a third region, formed in the surface of said divided pairs of first regions doped with a dopant having the first conductivity type; and a fourth region, formed in the surface of said third region forming a junction therebetween, and covering said third region, doped with a dopant having the second conductivity type, one of the bit lines connected to said fourth region and one of the word lines connected to said second region, the junction between said third region and said fourth region being selectively destroyed by applying a current from one of the bit lines to one of the word lines.

2. A memory cell according to claim 1, further comprising a second dielectric isolation means, formed between said second region and said third region, for isolating said second region from said third region.

3. A memory cell according to claim 2, wherein said second dielectric isolation means is formed by field oxidation.

4. A memory cell according to claim 2, wherein said second dielectric isolation means is a V-shaped groove filled with a dielectric insulating material.

5. A memory cell according to claim 1, wherein said first region is surrounded on first through third sides by said first dielectric isolation means and is surrounded at a remaining fourth side by said second dielectric isolation means.

6. A memory cell according to claim 5, wherein said second region is surrounded at first and second sides by said second dielectric isolation means and is surrounded at third and fourth sides by said first dielectric isolation means.

7. A memory cell according to claim 6, wherein said first dielectric isolation means is a U-shaped groove filled with a dielectric insulating material.

8. A memory cell according to claim 6, wherein said first dielectric isolation means is a V-shaped groove filled with a dielectric insulating material.

9. A memory cell according to claim 6, wherein said second dielectric isolation means is formed by field oxidation.

10. A memory cell according to claim 6, wherein said second dielectric isolation means is a V-shaped groove filled with a dielectric insulating material.

11. A memory cell according to claim 5, wherein said first dielectric isolation means is a U-shaped groove filled with a dielectric insulating material.

12. A memory cell according to claim 5, wherein said first dielectric isolation means is a V-shaped groove filled with a dielectric insulating material.

13. A memory cell according to claim 5, wherein said second dielectric isolation means is formed by field oxidation.

14. A memory cell according to claim 5, wherein said second dielectric isolation means is a V-shaped groove filled with a dielectric insulating material.

15. A memory cell according to claim 1, wherein said first dielectric isolation means is a U-shaped groove filled with a dielectric insulating material.

16. A memory cell according to claim 1, wherein said first dielectric isolation means is a V-shaped groove filled with a dielectric insulating material.

17. A memory cell according to claim 1, wherein the memory cell is composed of a transistor and a diode, wherein said first region is a base of said transistor, wherein said third region is an emitter of said transistor and is an anode of said diode, and wherein said fourth region is a cathode of said diode.

18. A junction-shorting type programmable read only memory including word lines, bit lines intersecting the word lines, and memory cells formed at the intersection of the word lines and bit lines, each of said memory cells comprising:

a substrate having a first conductivity;

a pair of first regions having a second conductivity opposite the first conductivity and formed on said substrate;

a first dielectric isolation means, surrounding said first region and extending into said substrate, for isolating said first region;

a second region, having the second conductivity, formed between each of said pair of first regions and contacting said semiconductor substrate;

a second dielectric isolation means, formed adjacent first and second sides of said second region which face each other;

a third region, formed in the top portion of said pair of first regions doped with a dopant having the first conductivity, formed on said first region, and isolated from said second region by said second dielectric isolation means; and a fourth region, doped with a dopant having the second conductivity, formed in a top portion of and covering said third region, forming a junction therebetween, and extending onto said first region, a respective one of the bit lines being connected to said fourth region, and a respective one of the word lines being connected to said second region, the junction between said third region and said fourth region being selectively destroyed by applying a current from one of the bit lines to one of the word lines.

19. A memory cell according to claim 18, wherein the memory cell is composed of a transistor and a diode, wherein said first region is a base of said transistor, wherein said third region is an emitter of said transistor and is an anode of said diode, and wherein said fourth region is a cathode of said diode.

20. A memory cell according to claim 19, wherein said second region prevents diffusion of minority carrier of said base region of said transistor into an adjacent base region of another transistor formed therein.

21. A memory cell according to claim 18, wherein said second region is formed by doping in the central area of said first region with a dopant having the second conductivity type.

22. A memory cell according to claim 18, wherein said first dielectric isolation means is a U-shaped groove filled with dielectric insulating material.

23. A memory cell according to claim 18, wherein said first dielectric isolation means is a V-shaped groove filled with dielectric insulating material.

24. A memory cell device according to claim 18, wherein said first region includes a thick portion and a thin portion, wherein said third portion has a thickness of approximately 2 $\mu$m and said thin portion has thickness of approximately 1 $\mu$m.

* * * * *

UNITED STATES PATENT AND TRADEMARK OFFICE
CERTIFICATE OF CORRECTION

PATENT NO. : 4,792,833
DATED : DECEMBER 20, 1988
INVENTOR(S) : TOSHITAKA FUKUSHIMA

It is certified that error appears in the above-identified patent and that said Letters Patent is hereby corrected as shown below:

FRONT PAGE [56] References Cited, Col. 2, line 2, after "187-194.", insert the following:

--Patent Abstracts of Japan, Vol. 8, No. 131, June 19, 1984 & JP-A-59 43 566.--.

Col. 2, line 43, "$\beta m^2$" should be --$\mu m^2$--.

Col. 5, line 62, "$n^{30}$" should be --$n^+$--.

Col. 8, line 57, "oonduction" should be --conduction--.

Signed and Sealed this

Sixteenth Day of May, 1989

Attest:

DONALD J. QUIGG

Attesting Officer

Commissioner of Patents and Trademarks